United States Patent [19]
Kubota et al.

[11] Patent Number: 5,805,627
[45] Date of Patent: Sep. 8, 1998

[54] LASER DIODE AND OPTICAL COMMUNICATIONS SYSTEM USING SUCH LASER DIODE

[75] Inventors: Shinichi Kubota; Haruhisa Soda, both of Kawasaki, Japan

[73] Assignee: Fujitsu Limited, Kanagawa, Japan

[21] Appl. No.: 546,895

[22] Filed: Oct. 23, 1995

[30] Foreign Application Priority Data

Feb. 7, 1995 [JP] Japan .................................... 7-019037

[51] Int. Cl.⁶ ................................ H01S 3/19; H01S 3/00
[52] U.S. Cl. ................................ 372/46; 372/45; 359/341
[58] Field of Search ................................ 372/45, 46, 49, 372/6, 75; 359/341, 344

[56] References Cited

U.S. PATENT DOCUMENTS

| | | | |
|---|---|---|---|
| 4,653,059 | 3/1987 | Akiba et al. | 372/50 |
| 4,833,684 | 5/1989 | Krekels et al. | 372/49 |
| 5,377,294 | 12/1994 | Onishi et al. | 372/6 |

FOREIGN PATENT DOCUMENTS

| | | |
|---|---|---|
| 59-6588 | 1/1984 | Japan . |
| 64-10690 | 1/1989 | Japan . |

OTHER PUBLICATIONS

H.C. Casey, Jr. et al., Heterostructure Lasers (Part A: Fundamental Principles), p. 43, 1978.

H.C. Casey, Jr. et al., Heterostructure Lasers(Part B: Materials and Operating Characteristics), pp. 12 and 25, 1978.

*Primary Examiner*—Rodney B. Bovernick
*Assistant Examiner*—Luong-Quyen T. Phan
*Attorney, Agent, or Firm*—Armstrong, Westerman, Hattori, McLeland & Naughton

[57] ABSTRACT

Embedded layers having a high resistance or an inverse conductivity with respect to a ridge structure are formed on either side of a ridge structure which is formed to correspond to an light emission region of a laser diode. The embedded layers confines a current in the ridge structure and moderates light-confinement performance in the ridge structure at an emitting end of the laser diode.

9 Claims, 12 Drawing Sheets

FIG.7B
LIGHT INTENSITY

FIG.7C
CARRIER DENSITY

FIG.7D
REFRACTIVE INDEX

LASER DIODE AND OPTICAL COMMUNICATIONS SYSTEM USING SUCH LASER DIODE

BACKGROUND OF THE INVENTION

1. Field of the Invention

The present invention generally relates to semiconductor devices, and more particularly to a laser diode useful in an optical communications system, a method for fabricating the same, and an optical communications system in which such a laser diode is used.

In an optical communications system in which an optical fiber is used to transmit information, there is provided a repeater for compensating optical loss produced as an optical signal is transmitted in the optical fiber. In such a repeater, a construction whereby an optical signal is converted into an electrical signal and is then amplified before being converted again into an optical signal is used. This kind of repeater requires an optical-electrical converter and an electric-optical converter, and, accordingly, its construction tends to be complex. A problem of reliability is presented if a repeater is installed in a place not easily accessed when a failure occurs. This is particularly true in the case of an undersea optical cable.

There is a proposal for an optical repeater whereby an optical signal in an optical fiber is amplified by a light amplifier. The light amplifier may be similar to a laser diode constructed such that an optical signal input to an end is amplified by stimulated emission before going out from the other end. Alternatively, we may use an optical fiber amplifier which induces stimulated emission in the optical fiber and causes light amplification to take place while the optical signal is transmitted in the optical fiber. In the latter optical fiber amplifier, pumping light having a resonance wavelength is injected in the optical fiber so as to excite dopant atoms in the optical fiber to a energy level higher. As a result of this, stimulated emission is created when an optical signal having a relatively lower energy level is incident on the optical fiber so that an amplification of the optical signal takes place. In such an optical fiber amplifier, a coherent light source capable of efficiently injecting pumping light in the optical fiber when the optical fiber amplifier is coupled to the optical fiber is necessary. A laser diode is most suitable as a coherent light source because of its compactness, durability, small power consumption, and high reliability.

2. Description of the Prior Art

Figure 1:
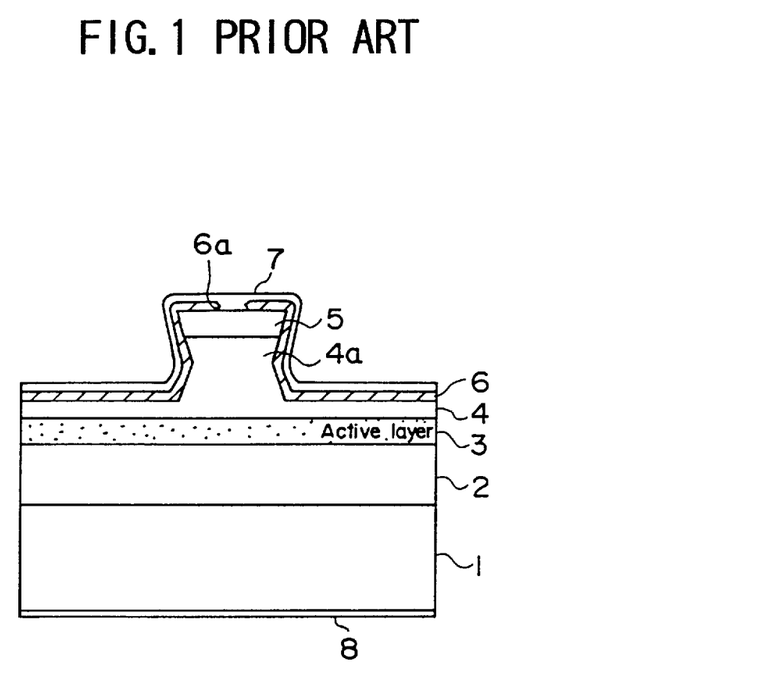
FIG. 1 is a lateral sectional view showing the construction of the conventional ridge laser diode.

FIG. 1 shows the construction of a so-called ridge laser diode, a type generally used in the prior art.

Referring to FIG. 1, a laser diode is formed on a semiconductor substrate 1. Typically, the semiconductor substrate 1 is constructed by doping an n-type GaAs base with a group III–V compound semiconductor. The laser diode includes an n-type lower clad layer 2 formed on the substrate 1, a non-doped active layer 3 formed on the clad layer 2, and a p-type upper clad layer 4 formed on the active layer 3. For the purpose of confining the driving current injected into the active layer 3, a mesa 4a is formed in the clad layer 4 so as to correspond to an emission region in the active layer 3. A $p^+$-type contact layer 5 is formed on the mesa 4a so as to reduce the value of resistance and facilitate the injection of the driving current. The clad layer 4 and the contact layer 5 are protected by an insulating film 6 formed of an $SiO_2$ or SiN. An upper electrode 7 formed on the insulating film 6 is in contact with the contact layer 5 via a contact hole 6a formed in the insulating film 6 so as to correspond to the mesa 4a. Another electrode 8 is formed on the lower major surface of the substrate 1. In the laser diode having the above-described construction, the driving current injected from the electrode 7 into the mesa 4a via the contact hole 6a and the contact layer 5 is concentrated in an area immediately below the mesa 4a of the active layer 3, thereby causing an emission of light. In the laser diode having the above-described construction, the mesa 4a and the contact layer 5 above forms a ridge structure.

Figure 2:
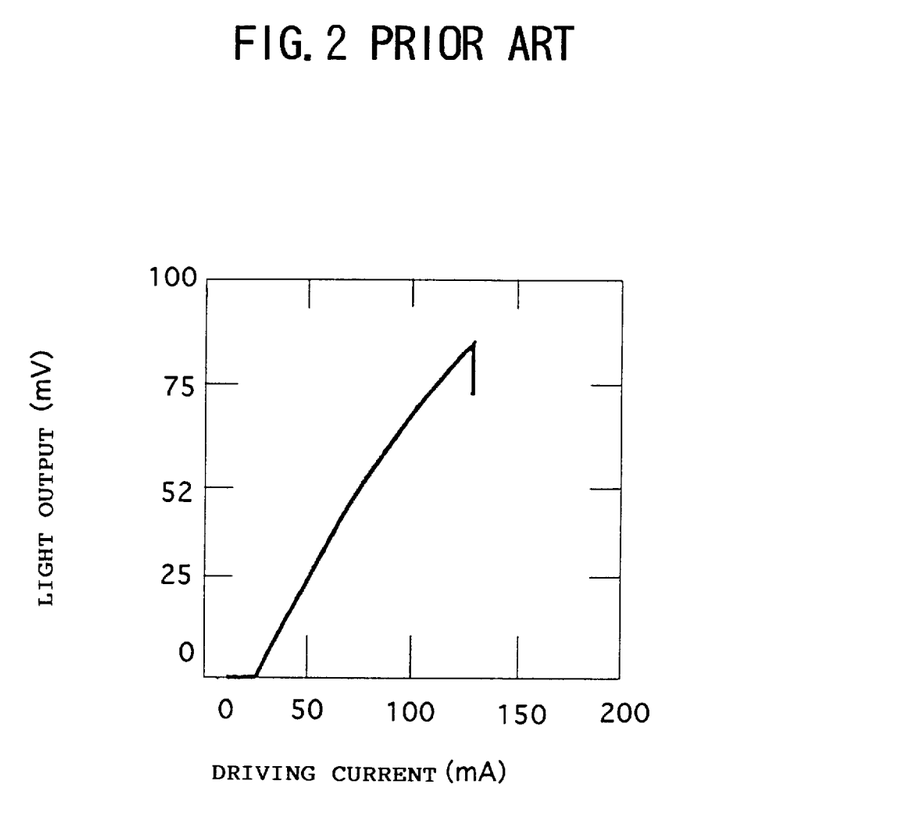
FIG. 2 is a graph showing the light output characteristic of the laser diode of FIG. 1.

FIG. 2 shows a light output characteristic of such a laser diode. Referring to FIG. 2, the driving current is plotted horizontally, and the light output of the laser diode is plotted vertically. It will be found from FIG. 2 that the laser diode starts an oscillation when the driving current is about 20 mA. As the driving current increases, the light output increases. As a result of the driving current being confined by the mesa structure, the threshold value of laser oscillation substantially drops so that efficient laser oscillation is attained. In the laser diode of FIG. 1, the mesa 4a and the contact layer 5 constituting the ridge are bordered on both sides by the air, which is characterized by a low refractive index. Therefore, light produced in the active layer 3 is confined in a region near the ridge, which is characterized by a high refractive index (refractive index waveguiding). Consequently, stimulated emission in the active layer 3 is facilitated. The characteristic shown in FIG. 2 is obtained in an experiment with the laser diode where the width of the ridge is set to 5 μm, the thickness of the clad layer 4 excluding the mesa 4a is set to 150 nm.

When such a ridge laser diode is optically coupled to the optical fiber, it is desirable that the laser diode has a generally circular, single-mode, extended near-field pattern at the emitting end with respect to the optical axis of the emitted light, so that a light beam emitted from an emitting end of the laser diode is efficiently incident on the core of the optical fiber. However, in the laser diode having the construction shown in FIG. 1, light produced in the active layer 3 is optically confined in the region near the ridge which includes the mesa 4a. The boundary condition that causes light to be transversely confined tends to produce a laser oscillation containing a higher mode other than the basic transverse mode. More specifically, although the laser diode oscillates in the basic transverse mode having an ideal near-field pattern immediately after the driving current exceeds a threshold level for oscillation, a further increase in the driving current gives rise to a hole burning effect wherein a powerful output light induces depletion of carriers in the active layer. Referring to FIG. 1, an emission position in the active layer 3 shifts to different locations near the ridge. This phenomenon is known as mode hopping. In the light output characteristic of FIG. 2, the effect of the multimode laser oscillation is superimposed on the single-mode characteristic, resulting in an appearance of a smooth, monotonous increase in the light output with the driving current.

When the multimode oscillation is generated, the near-field pattern of a light beam emitted from the emitting end of the laser diode is severely disturbed, causing the efficiency in injecting the laser output light into the optical fiber to be substantially reduced. Since the near-field pattern varies depending on the light output level of the laser diode, that is, the driving power, the light output level observed at the far end of the optical fiber appears to be varying irregularly with the driving power of the laser diode. In this way, efficient optical coupling of the laser diode having the conventional construction shown in FIG. 1 to the optical fiber is difficult to achieve.

In order to suppress the multimode oscillation described above in the laser diode employing the refractive index waveguiding characterized by a large difference in the refractive index between the ridge and the surrounding air, it is necessary to construct the ridge to be as narrow as possible. The ridge narrower than 5 micron causes the light intensity per a unit area to become so high that the laser diode may be destructed.

Figure 3:
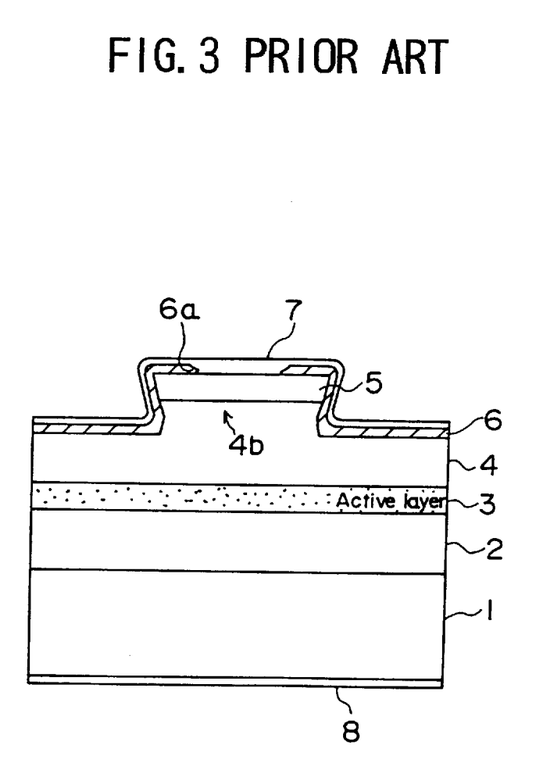
FIG. 3 is a lateral sectional view showing the construction of another conventional ridge laser diode.

In order to eliminate the aforementioned problems with the conventional laser diode, there is proposed a laser diode, having the construction as shown in FIG. 3 wherein light-confinement near the ridge is weakened. In FIG. 3, those parts that correspond to the parts of FIG. 1 are designated by the same reference numerals and the description thereof is omitted.

Referring to FIG. 3, the laser diode is configured such that a mesa 4b wider than the mesa 4a of FIG. 1 is formed on the upper clad layer 4 so that the clad layer 4b and the contact layer 5 form the ridge structure. In the laser diode of FIG. 3, the clad layer 4 outside the ridge is configured to be thicker than in the construction of FIG. 1. Specifically, the thickness of the clad layer 4 of FIG. 3 is set to about 400 nm. Consequently, the laser diode of FIG. 3 has a weaker transverse light-confinement according to the refractive index waveguiding than the laser diode of FIG. 1. Therefore, in the laser diode of FIG. 3, laser oscillation in the basic transverse mode can be easily achieved even if the ridge is wide.

Figure 4:
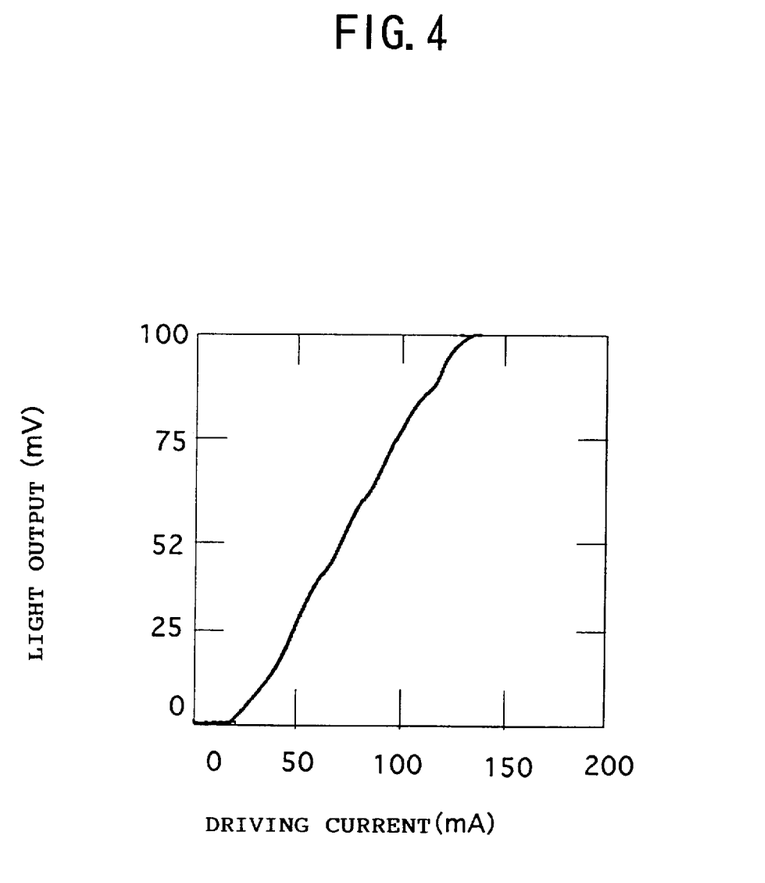
FIG. 4 is a graph showing the light output characteristic of the laser diode of FIG. 3.

However, there is a problem in the laser diode of FIG. 3. As has been described, the clad layer 4 outside the ridge is relatively thick so that the driving current injected via the mesa 4b tends to diffuse transversely in the clad layer 4 instead of being injected into the active layer directly. The driving current thus diffused transversely is injected into the active layer 3 outside the ridge, thereby inducing the hole burning according to the gain waveguiding mode. A higher-mode oscillation according to the gain waveguiding mode is then generated in the laser diode, causing the injection of the driving current in the active layer 3 to become unstable. Thus, a irregular variation in the light output characteristic as shown in FIG. 4 is produced. In response to such an oscillation in the light output characteristic, the near-field pattern of the emitted light varies. As result, the optical coupling between the laser diode and the optical fiber is subject to change.

SUMMARY OF THE INVENTION

Accordingly, an object of the present invention is to provide a novel and useful laser diode, a method for fabricating the same, and an optical communications system using such a laser diode, wherein the aforementioned problems are resolved.

Another and more specific object of the present invention is to provide a laser diode in which the optical coupling with an optical fiber is improved, a method of fabricating the same, and an optical communications system using such a laser diode.

Still another object of the present invention is to provide a ridge laser diode and a method of fabricating the same, wherein a multimode laser oscillation according to the refractive index waveguiding mode is suppressed by weakening transverse light-confinement, and laser oscillation according to the gain waveguiding mode is suppressed by efficiently confining a current in the ridge.

The aforementioned objects can be achieved by a laser diode comprising: a semiconductor substrate extending axially from a first end face to a second end face and having a first conductivity; a first clad layer formed on the semiconductor layer, extending axially from a third end face that corresponds to the first end face to a fourth end face that corresponds to the second end face, and having the first conductivity; an active layer formed on the first clad layer, extending axially from a fifth end face that corresponds to the third end face to a sixth end face that corresponds to the fourth end face, and producing a light beam according to stimulated emission; a second clad layer formed on the active layer, extending axially from a seventh end face that corresponds to the fifth end face to an eighth end face that corresponds to the sixth end face, and having a second conductivity different from the first conductivity; a ridge region formed on the second clad layer so as to project upward, extending axially from a ninth end face that corresponds to the seventh end face to a tenth end face that corresponds to the eighth end face, and having the second conductivity; a first electrode connected to electrically to the substrate and injecting carriers having a first polarity into the active layer; a second electrode connected to the ridge region and injecting carriers having a second and inverse polarity to the active layer via the ridge region; and a pair of embedded regions provided on either side of the ridge region on the second clad layer to a thickness not exceeding a height of the ridge region, and extending axially from an eleventh end face that corresponds to the ninth end face to a twelfth end face that corresponds to the tenth end face, so as to confine a current in the second clad layer. According to the laser diode of the present invention, light-confinement performance in the ridge region is moderated by forming embedded regions having a substantially same refractive index as the ridge region, on either side of the ridge region, wherein the ridge region guides a light beam formed in the laser diode. Hence, multimode oscillation according to refractive index waveguiding is suppressed. By constructing the embedded regions of a high resistance layer, or by doping the embedded regions so as to impart thereto an inverse conductivity with respect to the ridge region and the second clad layer, it is possible to confine an injected driving current in the ridge region and suppress higher-mode laser oscillation, in the gain waveguiding mode, caused by diffusion of the driving current. As a result of this, a light beam emitted from an emitting end of the laser diode exhibits a generally circular near-field pattern concentrated around the optical axis. In this way, a stable light injection into an optical fiber is attained. Specifically, by configuring the embedded regions to be thicker at the emitting end provided with an antireflection film than at the other end of the laser diode, the near-field pattern of the emitted light is further improved.

The aforementioned objects can also be achieved by a method for fabricating a ridge stripe laser diode, comprising the steps of: 1) forming a semiconductor substrate so as to extend from a first end face to a second end face and have a first conductivity; 2) forming a first semiconductor layer having the first conductivity as a first clad layer, so as to extend from the first end face to the second end face; 3) forming a laser diode active layer on the first clad layer so as to extend from the first end face to the second end face; 4) forming a second semiconductor layer having a second and inverse conductivity on the active layer so as to extend from the first end face to the second end face; 5) forming a first mask pattern on the second semiconductor layer so as to extend from the end face to the second end face with a substantially regular width, and forming a second mask pattern having a first width at the first end face and a second width smaller than the first width at the second end face, on either side of the first mask pattern, such that there are created openings having a third width at the first end face and a fourth width greater than the third width at the second end face, between the first mask pattern and the second mask pattern; 6) etching the second semiconductor layer using the mask patterns as a mask to a depth at which a lower portion of the second semiconductor layer remains unetched, so as to form, on the active layer, a second clad layer having a ridge portion and a pair of trenches, the ridge portion extending from the first end face to the second end face with a substantially regular width and the pair of trenches extending on either side of the ridge portion and having a width that corresponds to the third width at the first end face and a width that corresponds to the fourth width at the second end face; 7) building a third semiconductor layer on each of the pair of trenches so as to have a first thickness not exceeding a height of the ridge portion at the first end face and a second thickness smaller than the first thickness at the second end face. According to the method for fabricating the laser diode of the present invention, simple steps make it possible to form the embedding regions whose thickness varies between the emitting end and the reflecting end of the laser diode, on either side of the ridge region.

The aforementioned objects can also be achieved by an optical communications system comprising: a first optical fiber transmitting an optical signal having a first wavelength and incident on a first end, and emitting the optical signal from a second end; a second optical fiber coupled at one end to said first optical fiber between said first end and said second end; and a laser diode optically coupled to the other end of said second optical fiber and oscillating at a second wavelength shorter than said first wavelength, wherein said laser diode comprising: a semiconductor substrate extending axially from a first end face to a second end face and having a first conductivity; a first clad layer formed on said semiconductor layer, extending axially from a third end face that corresponds to said first end face to a fourth end face that corresponds to said second end face, and having said first conductivity; an active layer formed on said first clad layer, extending axially from a fifth end face that corresponds to said third end face to a sixth end face that corresponds to said fourth end face, and producing a light beam according to stimulated emission; a second clad layer formed on said active layer, extending axially from a seventh end face that corresponds to said fifth end face to an eighth end face that corresponds to said sixth end face, and having a second conductivity different from said first conductivity; a ridge region formed on said second clad layer so as to project upward, extending axially from a ninth end face that corresponds to said seventh end face to a tenth end face that corresponds to said eighth end face, and having said second conductivity; an antireflection film formed on said first, third, fifth, seventh and ninth end faces; a reflecting film formed on said second, fourth, sixth, eighth and tenth end faces; a first electrode connected to electrically to said substrate and injecting carriers having a first polarity into said active layer; and a second electrode connected to said ridge region and injecting carriers having a second and inverse polarity to said active layer via said ridge region, wherein a pair of embedded regions extending axially from an eleventh end face that corresponds to said ninth end face to a twelfth end face that corresponds to said tenth end face and confining a current in said second clad layer are provided on either side of said ridge region on said second clad layer to a thickness not exceeding a height of said ridge region, said antireflection film covers said eleventh end face, and said reflecting film covers said twelfth end face. According to the optical communications system of the present invention, it is possible to obtain a highly efficient optical fiber amplifier in which a laser diode having a high optical coupling efficiency with respect to an optical fiber is used as a pumping light source.

DESCRIPTION OF THE PREFERRED EMBODIMENTS

Other objects and further features of the present invention will be apparent from the following detailed description when read in conjunction with the accompanying drawings, in which.

DESCRIPTION OF THE PREFERRED EMBODIMENTS

Figure 5:
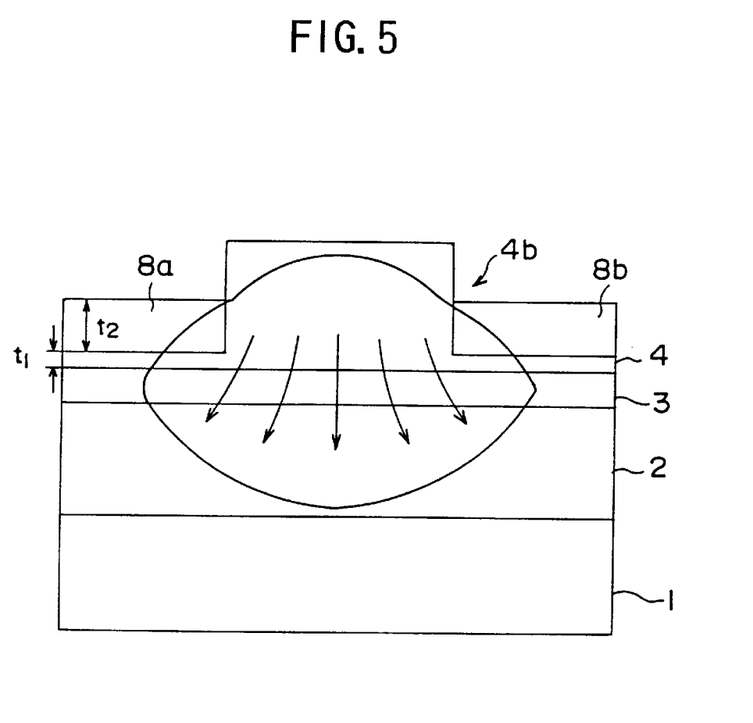
FIG. 5 shows the operating principle of the present invention.

FIG. 5 shows the operating principle of the present invention. Those parts that correspond to the parts described earlier are designated by the same reference numerals and the description thereof is omitted.

Referring to FIG. 5, the thickness $t_1$ of the clad layer 4 is substantially reduced as compared to that of FIG. 3. Further, n-type regions 8a and 8b are formed on the clad layer 4 so as to be adjacent to the ridge 4b, The n-type regions 8a and 8b form a p-n junction with the adjacent p-type clad layer or the p-type ridge 4b, As indicated by the arrow in FIG. 5, a depletion layer resulting from the p-n junction effectively confines the driving current injected into the ridge 4b in the ridge 4b so that the driving current is injected into the active layer 3 immediately below the ridge 4b, That is, the n-type regions 8a and 8b in this construction form a structure for confining the current by efficiently preventing transversal diffusion of the driving current injected into the ridge 4b, Thus, laser oscillation according to the gain waveguiding mode outside the ridge 4b is suppressed in the active layer 3. An additional advantage of this laser diode is that, since the ridge 4b is flanked by the n-type regions 8a and 8b having a similar refractive index as the ridge 4b, light-confinement in the ridge 4b is substantially weakened so that laser oscillation in the basic transverse mode is obtained. Consequently, as indicated in FIG. 5, the output light has a field distribution (near-field pattern) exhibiting a concentration around the optical axis. The light beam having such a near-field pattern enables an efficient optical coupling with a core in an optical fiber.

Figure 6:
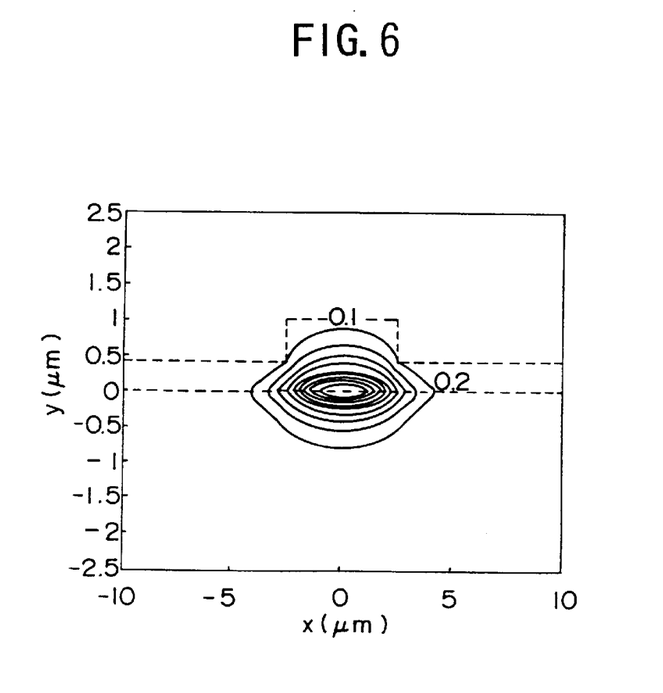
FIG. 6 shows a near-field pattern obtained according to the present invention.

FIG. 6 shows an example of exact calculations to obtain the near-field pattern only schematically shown in FIG. 5.

As indicated by dotted lines of FIG. 6, the structure used as a model for the calculations is configured such that a ridge having a width of 5 $\mu$m and a thickness of 600 nm is formed on the clad layer 4 having a thickness of 400 nm. Since the regions 8a and 8b forming the structure for confining the current are formed on the respective sides of the ridge, the driving current is prevented from diffusing from the ridge transversely. Any light emission other than that of the pattern shown in FIG. 6 may be neglected.

Figure 7A:
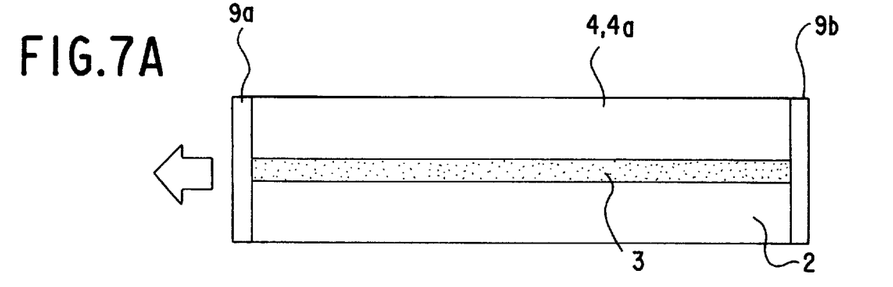
FIG. 7A is a longitudinal sectional view of the laser diode according to the present invention.
Figure 7B:
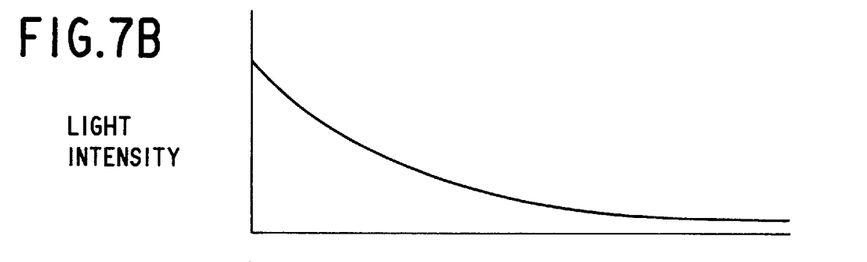
FIG. 7B shows a distribution of light intensity in the laser diode of FIG. 7A.

FIG. 7A is a longitudinal sectional view of the laser diode of FIG. 5. For the purpose of facilitating injection of light into an optical fiber, an antireflection film 9a is provided at the emitting end of the laser diode and a reflecting film 9b is provided at the other end. FIG. 7B shows a distribution of light intensity in the laser diode of FIG. 7A. It will be noted that light intensity has an asymmetrical distribution in the axial direction. This asymmetrical distribution is due to the fact that the reflected light is large at the reflecting end of the rear facet. For simplicity, the substrate 1 is omitted from the illustration, while the ridge 4a is included in the illustration.

Figure 7C:
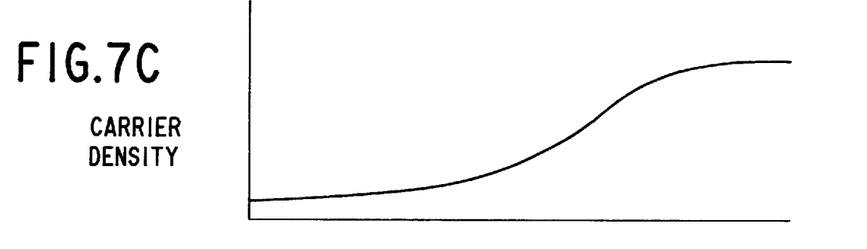
FIG. 7C shows a distribution of carriers in the laser diode of FIG. 7A.

An asymmetrical light intensity distribution like this in a system where stimulated emission is taking place induces an irregular distribution of carriers as shown in FIG. 7C. In a region where the light intensity is high, consumption of carriers due to stimulated emission is facilitated so that depletion of carriers results. On the other hand, carriers are not consumed as much and remain in excess in a region where the light intensity is low.

Carriers that remain in excess causes absorption of light due to a plasma effect to become active, resulting in a corresponding distribution of light absorption in the axial direction of the laser diode. Light absorption is related to refractive index according to Kramers-Kronig relation. Therefore, an asymmetrical distribution of refractive index as shown in FIG. 7D is exhibited in the laser diode.

Figure 7D:
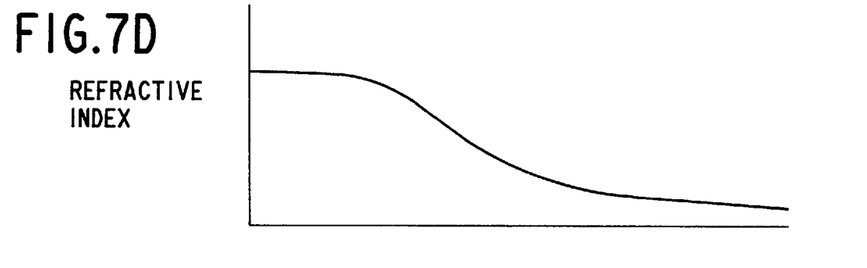
FIG. 7D shows a distribution of refractive index in the laser diode of FIG. 7A.

Referring to FIG. 7D, the laser diode has a maximum refractive index at the emitting end provided with the antireflection film 9a and a minimum refractive index at the reflecting end provided with the reflecting film 9b. Accordingly, if the thickness of the regions 8a and 8b is set such that light-confinement at the emitting end is a minimum, the refractive index of the regions 8a and 8b adjacent to the ridge 4b is higher than that of the ridge 4b at the reflecting end, thus creating anti-light-confinement. If the thickness of the regions 8a and 8b is set such that neither light-confinement nor anti-light-confinement occurs at the reflecting end, light-confinement occurs in the emitting end of the laser diode, causing a multimode laser diode oscillation.

Accordingly, in preferred embodiments of the present invention, the thickness of the regions 8a and 8b is made to vary in the axial direction of the laser diode so that light-confinement is optimized over the entirety of the laser diode. More specifically, thickness of the regions 8a and 8b is made to vary such that it is thicker toward the emitting end characterized by a high refractive index and thinner toward the reflecting end characterized by a low refractive index. In this way, it is possible to obtain a near-field pattern most suitable for coupling with an optical fiber, wherein a convergence with respect to the optical axis is observed.

Figure 8:
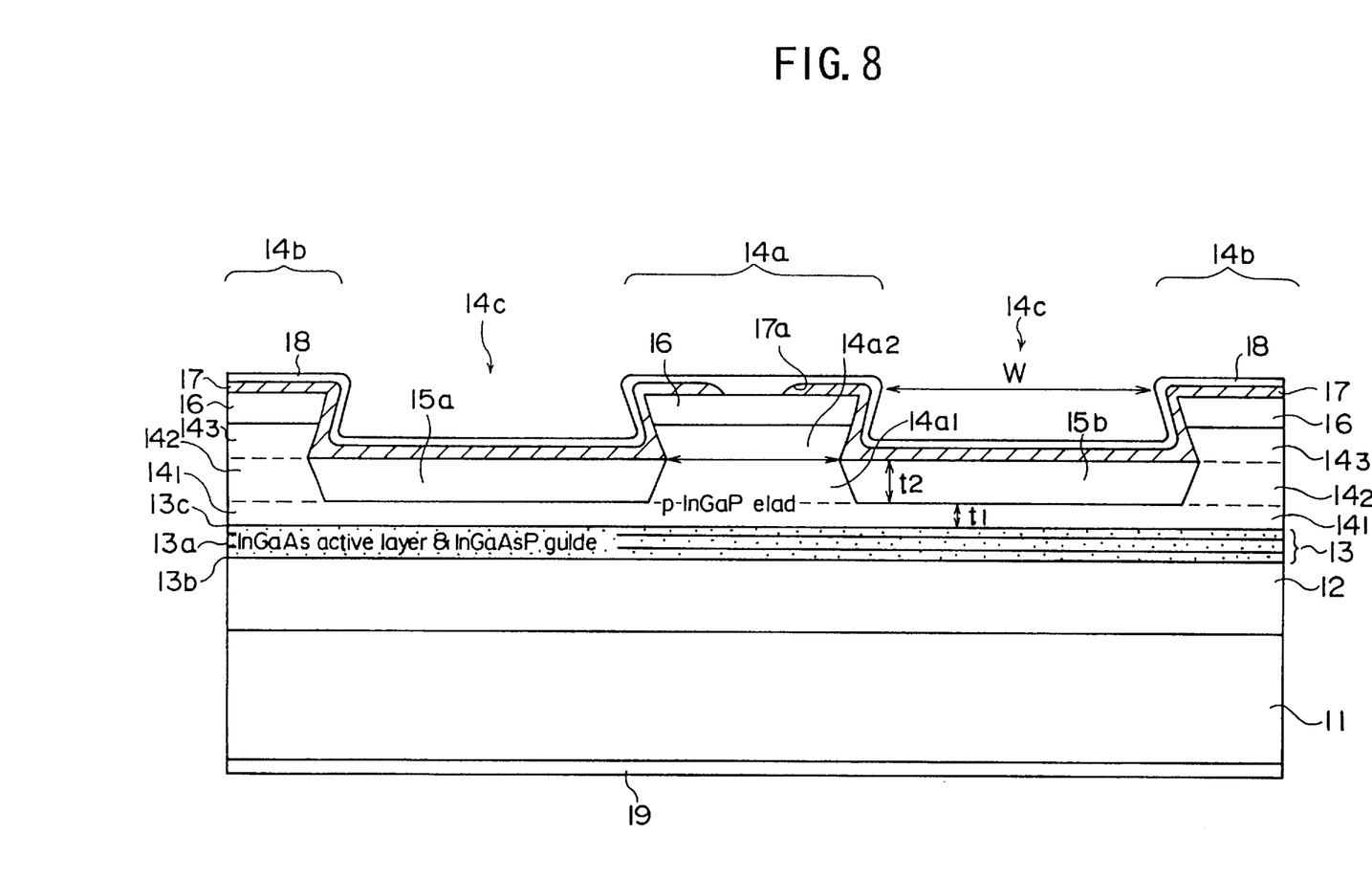
FIG. 8 is a lateral sectional view of the laser diode according to a first embodiment of the present invention, taken from the emitting end.

FIG. 8 is a lateral sectional view of the laser diode according to a first embodiment of the present invention, taken from the emitting end.

Referring to FIG. 8, the laser diode is used as a pumping light source for a 0.98 $\mu$m optical fiber amplifier. The laser diode is built on an n-type GaAs substrate 11 extending in the axial direction of the laser diode and has an active layer formed of a InGaAs.

A clad layer 12 formed of an n-type InGaP epitaxial layer having a composition lattice-matched to GaAs is formed on the substrate 11 to a thickness of 1.5–2.5 $\mu$m so as to extend from the emitting end to the reflecting end. Typically, the clad layer 12 has a thickness of 2.0 $\mu$m. An active structure 13 for generating a 0.98 $\mu$m laser oscillation is formed on the clad layer 12 so as to extend from the emitting end to the reflecting end. In the embodiment shown, the active structure 13 is composed of several groups of laminations one built upon the another, each group comprising: an optical guide layer 13b formed of a non-doped InGaAsP epitaxial layer to have a thickness of 30–70 nm (typically, 50 nm); an active layer 13a formed on the optical guide layer 13b of a non-doped InGaAsP epitaxial layer to have a thickness of 6–8 nm (typically, 7 nm); an optical guide layer 13c formed on the active layer 13a of a non-doped InGaAsP epitaxial layer to have a thickness of 30–70 nm (typically, 50 nm). Sandwiched by barrier layers (the optical guide layers 13b and 13c) characterized by a wide bandgap, the active layer 13a constitutes a multiple quantum well (MQW) structure. In such a multiple quantum well structure, density of states exhibits a step-like variation with the energy level. Hence, a relatively large density of states is ensured even near the lower edge of the band. Thus, an efficient laser oscillation is attained. Typically, one or two active layers 13a are incorporated in the active structure 13.

A clad layer 14₁ formed of a p-type InGaP epitaxial layer having a thickness of $t_1$ is formed on the active structure 13 to extend from the emitting end to the reflecting end. Referring to the sectional view of FIG. 8, at the center of the clad layer 14₁, a mesa structure 14$a_1$ having a height of $t_2$ and formed of a p-type InGaP epitaxial layer having the same composition as the clad layer 14₁ is provided so as to extend from the emitting end to the reflecting end in the axial direction of the laser diode. Further, a mesa structure formed of a p-type InGaP epitaxial layer having the same composition is formed on the mesa structure 14$a_1$ so as to extend from the emitting end to the reflecting end. Spaced apart from the mesa structure 14$a_1$, mesa structures 14₂ formed of a p-type InGaP epitaxial layer having the same composition as the clad layer $14_1$ are formed at the lateral sides of the laser diode. Further, mesa structures 143 formed of a p-type epitaxial layer having the same composition are formed on the respective mesa structures 142.

In this construction, the mesa structures $14a_1$ and $14a_2$ form a ridge structure 14a of the laser diode. The mesa structures $14_2$ and $14_3$ spaced apart from the ridge structure 14a form a terrace structure on either side of the ridge structure 14a. Consequently, a pair of trenches 14c are formed on either side of the ridge structure 14a. In the embodiment shown, the upper major surface of the clad layer $14_1$ is covered by a p-type GaAs layer (not shown in FIG. 8 but designated by 14e in FIG. 9) thinner than 10 nm used as an etching stopper in forming the mesa structure $14a_1$ or the mesa structure $14_2$.

In this embodiment, each of the trenches 14c have a width of W. Embedded layers 15a and 15b formed of an n-type InGaP layer having the same composition as the clad layer $14_1$ or a non-doped high-resistance InGaP layer are provided in the trenches 14c. The embedded layers 15a and 15b are formed so as not exceed the ridge structure 14a constituted of the mesa structures $14a_1$ and $14_2$ in height, at the emitting end shown in FIG. 8.

Figure 9:
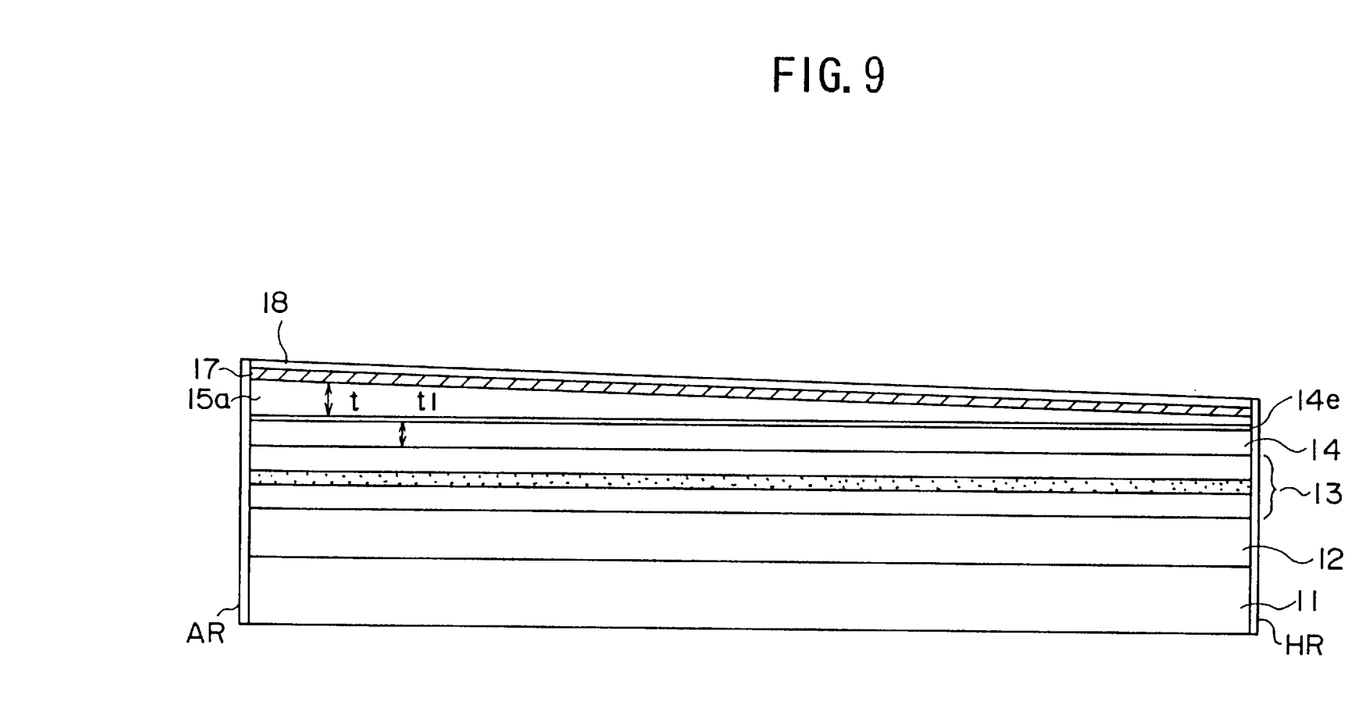
FIG. 9 is a longitudinal sectional view of the laser diode of FIG. 8.

FIG. 9 is a longitudinal sectional view of the laser diode taken along the embedded layer 15a. As shown in FIG. 9, the thickness of the embedded layers 15a and 15b is made to vary such that it is a maximum at the emitting end of the laser diode and a minimum at the reflecting end. Referring to the structure shown in FIG. 9, it is to be noted that the thickness of the embedded layers 15a and 15b are made to vary generally linearly between the emitting end and the reflecting end. As described later, the embedded layers having varying thickness can be formed by setting the width W of the trenches 14c to a minimum at the emitting end and a maximum at the reflecting end.

In the structure of FIG. 8, a contact layer 16 formed of a p-type GaAs layer is provided on the mesa structures $14a_2$ and $14_3$. An $SiO_2$ insulating film 17 having a uniform thickness is formed to cover the entirety of the structure including the contact layer 16. A contact hole 17a through which the contact layer 16 is exposed is formed in the insulating film 17 so as to correspond to the ridge structure 14a. Further, an electrode layer 18 having a uniform thickness is built on the insulating film 17. The electrode layer 18 is in electrical contact with the contact layer 16 and the underlying semiconductor layer via the contact hole 17a.

In the structure shown in FIG. 8, the ridge structure 14a is sandwiched by the embedded layers 15a and 15b whose refractive index is substantially equal to that of the ridge structure 14a. Therefore, light-confinement in the ridge structure is weakened accordingly. By setting the thickness $t_1$ to 150 nm, the thickness of the embedded layers 15a and 15b to 250 nm, and the width of the ridge structure 14a to 5.0 μm, a laser diode characterized by a single-mode oscillation is obtained. The composition of the embedded layers 15a and 15b is set such that the value indicating lattice mismatching of the embedded layers 15a and 15b with respect to the GaAs base is in the range between 0.3% and 0.0%. By setting the composition of the embedded layers 15a and 15b as above, the embedded layers 15a and 15b have a lattice constant slightly larger than the typical lattice constant. As a result of this, the refractive index of the embedded layers 15a and 15b is slightly lower than the refractive index of the ridge structure 14a. As a result of the refractive index of the embedded layers 15a and 15b being slightly lower than the refractive index of the ridge structure 14a, a desired weakened light-confinement occurs in the ridge structure 14a, while the anti-light-confinement does not occur. Thus, light is guided along the ridge structure 14a in a stable manner.

Referring back to the longitudinal sectional view of FIG. 9, an antireflection film AR is formed at the emitting end of the laser diode. A reflecting film HR is formed at the reflecting end. The thickness t of the embedded layers 15a and 15b is made to vary generally linearly between the reflecting end and the emitting end. In this construction, light-confinement in the ridge structure 14a is weakest at the emitting end and grows stronger toward the reflecting end. As a result of this axial variation in the intensity of light-confinement, the gain near the reflecting end increases so that the efficiency of the laser diode as a whole is increased. Asymmetry in laser oscillation as shown in FIGS. 7A–7D is remedied.

To summarize the above, according to the laser diode as described with reference to FIGS. 8 and 9, the near-field pattern of the output light at the emitting end is improved, and a stable optical coupling of the laser diode with an optical fiber is attained.

A description will now be given, with reference to FIGS. 10A–10C, FIGS. 11A–11C, and FIGS. 12A and 12B, of how the laser diode as described with reference to FIGS. 8 and 9 is fabricated.

Figure 10A:
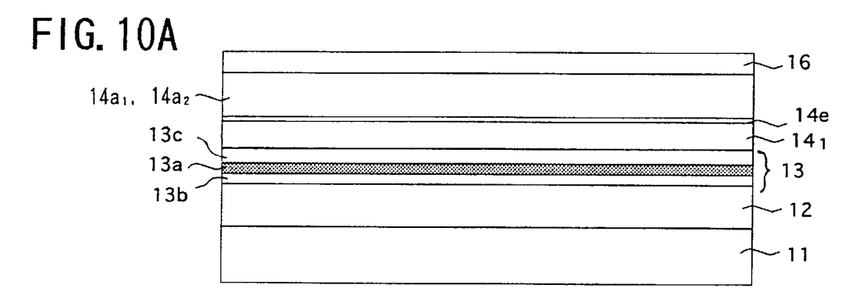
FIG. 10A is a lateral sectional view showing a step in a fabrication of the laser diode of FIG. 8.

FIG. 10A is a lateral sectional view showing a step in a fabrication of the laser diode of FIG. 8. A laminated structure in which the semiconductor layers 12–16 are sequentially built is formed on the GaAs substrate 11. As has been described, the active structure 13 is constructed such that the active layer (quantum well layer) 13a is sandwiched by the optical guide layers (barrier layers) 13b and 13c. The p-type GaAs layer 14e functioning as an etching stopper is formed on the clad layer $14_1$. The InGaP layers $14a_1$ and $14a_2$ are formed in successive processes on the GaAs layer 14e as an integrated epitaxial layer. Formation of the layers 12–16 may be performed using a known MBE method or MOVPE method.

Figure 10B:
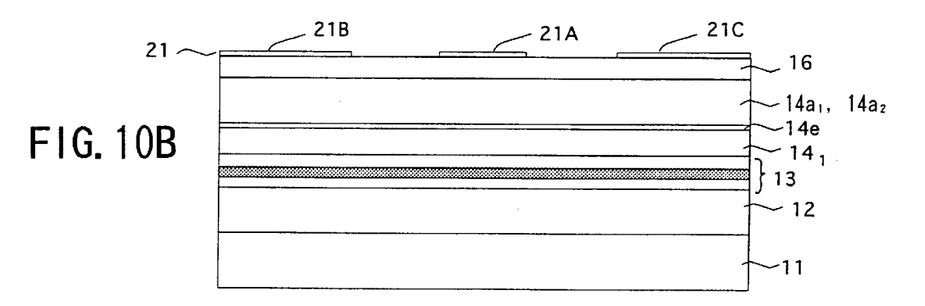
FIG. 10B is a lateral sectional view showing another step in a fabrication of the laser diode of FIG. 8.

FIG. 10B is a lateral sectional view showing another step in a fabrication of the laser diode of FIG. 8. In the step shown in FIG. 10B, a mask 21 is formed on the contact layer 16 by building and patterning an insulating layer formed, for example, of an $SiO_2$.

Figure 10C:
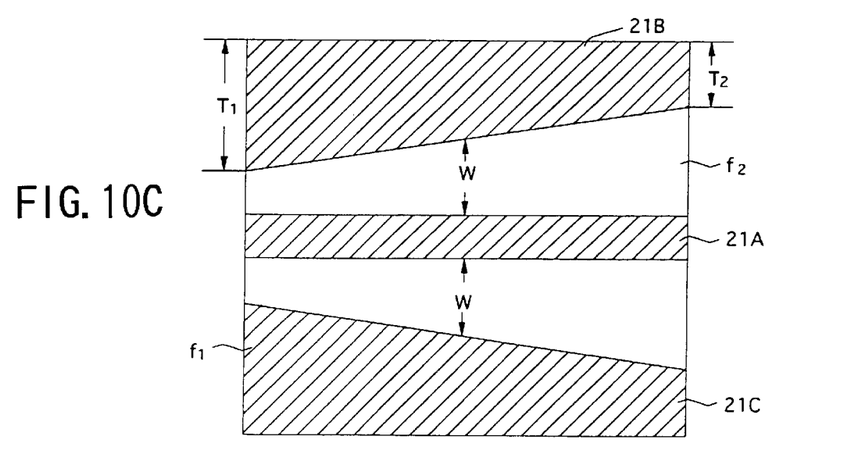
FIG. 10C is a top view of the structure shown in FIG. 10B.

FIG. 10C is a top view of the structure shown in FIG. 10B. In FIG. 10C, an emitting end face is denoted by $f_1$ and a reflecting end face is denoted by $f_2$. As shown in FIG. 10C, the mask 21 includes a first mask pattern 21A extending from the emitting end face $f_1$ to the reflecting end face $f_2$ with a regular width, a trapezoidal second mask pattern 21B laterally displaced from the mask pattern 21A in a direction and having a maximum width $T_1$ at the end face $f_1$ and a minimum width $T_2$ at the end face $f_2$, and a mask pattern 21C formed opposite to the mask pattern 21B across the intervening are including the mask pattern 21A and having the same configuration as the mask pattern 21B. The surface of the contact layer 16 is exposed between the mask patterns 21A and 21B, and between the mask patterns 21A and 21C. It will be found in FIG. 10C that the surface of the exposed contact layer 16 is also generally trapezoidal, the width W thereof increasing away from the end face $f_1$ and toward the end face $f_2$ generally linearly.

Figure 11A:
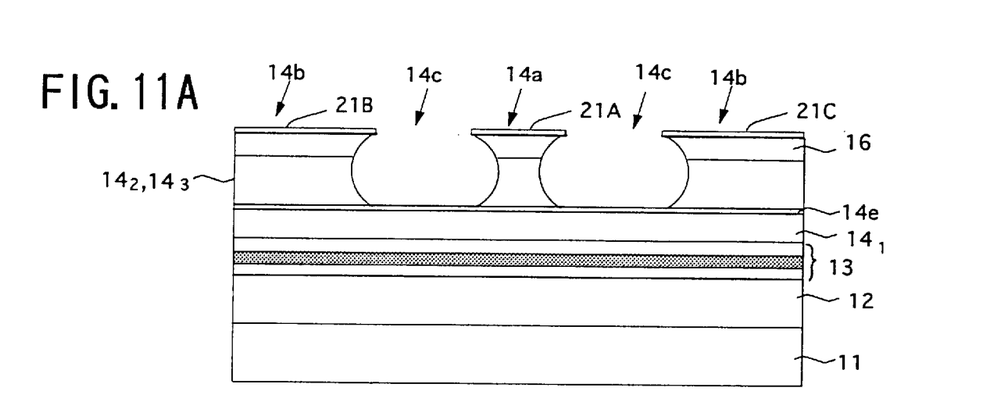
FIG. 11A is a lateral sectional view showing still another step in a fabrication of the laser diode of FIG. 8.

The semiconductor laminated structure having the mask 21 formed thereon is then processed by wet etching, which is known to have a selective action on the semiconductor layer containing In, resulting in the structure shown in FIG. 11A. Thus, the trench 14c in which the etching stopper 14e is exposed is formed on either side of the ridge structure 14a. Portions protected by the mask patterns 21B and 21C present terrace structures 14b.

Figure 11B:
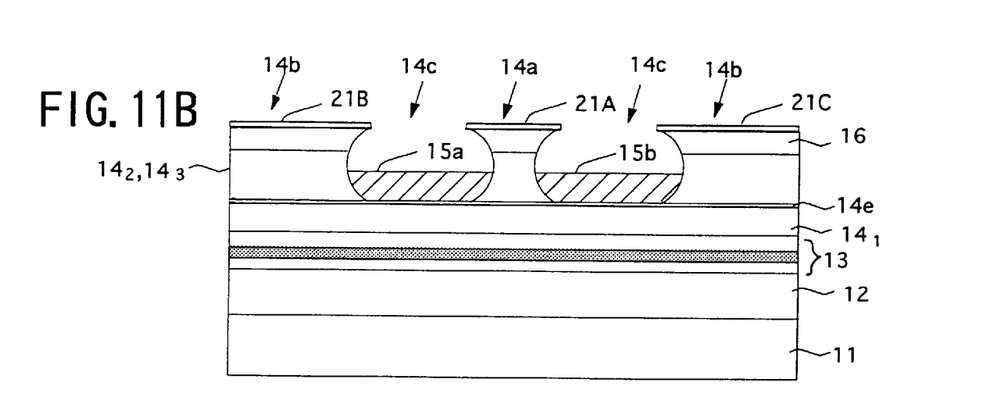
FIG. 11B is a lateral sectional view showing still another step in a fabrication of the laser diode of FIG. 8.

An n-type InGaP layer or a non-doped InGaP layer is built on the structure shown in FIG. 11A using the MOVPE method, while the mask 21 is made to remain, so as to form the embedded layers 15a and 15b. As a result, the structure shown in FIG. 11B is obtained. By removing the mask 21 from the structure shown in FIG. 11B, the structure shown in FIG. 11C, which corresponds to the lateral sectional view of FIG. 8, is obtained.

Figure 11C:
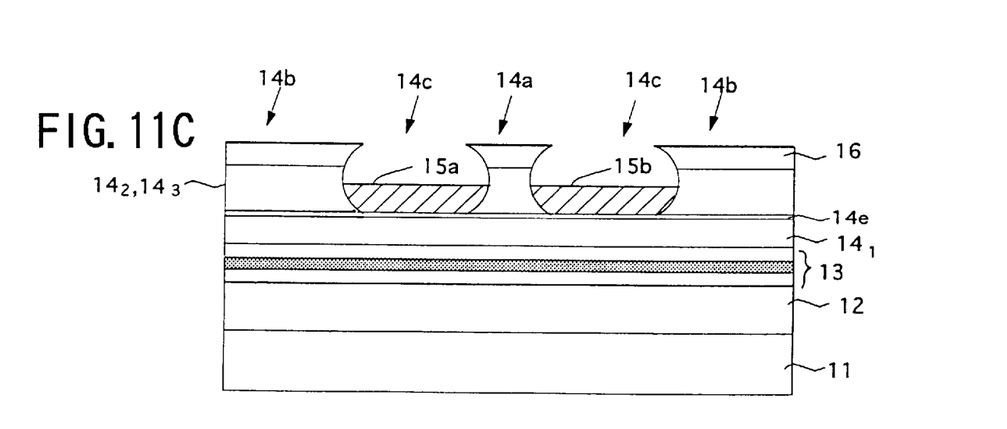
FIG. 11C is a lateral sectional view showing still another step in a fabrication of the laser diode of FIG. 8.

In the structures shown in FIG. 11B and 11C, it is assumed that atoms for forming the embedded layers 15a and 15b move sideways on the mask patterns 21A–21C before reaching the trench 14c. Therefore, the embedded layers 15a and 15b are formed to be relatively thick in an area near the end face $f_1$ where a large area is masked. Conversely, the embedded layers 15a and 15b are formed to be relatively thin in an area near the end face $f_2$ where a small area is masked. Consequently, the embedded layers 15a and 15b in the trench 14c are thicker toward the end face $f_1$ and thinner toward the end face $f_2$.

Figure 12A:
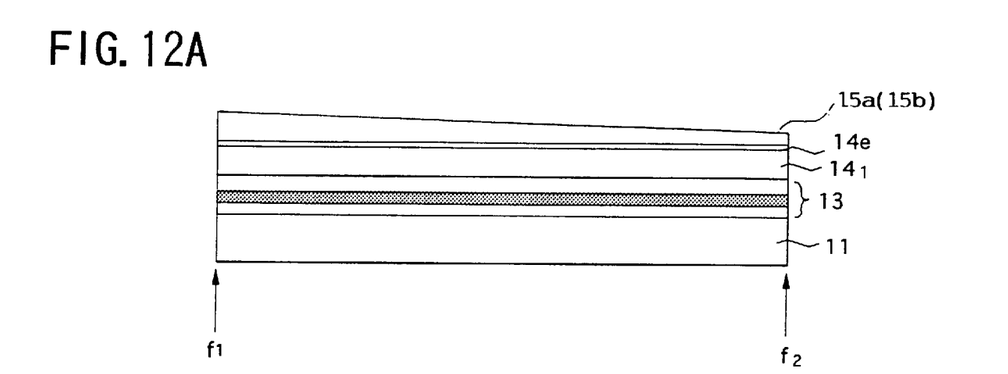
FIG. 12A is a longitudinal sectional view taken along embedded layers in the structure of FIG. 11C.

FIG. 12A is a longitudinal sectional view taken along the embedded layers 15a (15b) in the structure of FIG. 11C. That is, the sectional view of FIG. 12A corresponds to the sectional view of FIG. 9. As shown in FIG. 12A, in the axial direction of the laser diode, the thickness of the embedded layer 15a and 15b is tapered to decrease away from the end face $f_1$ and toward the end face $f_2$.

Figure 12B:
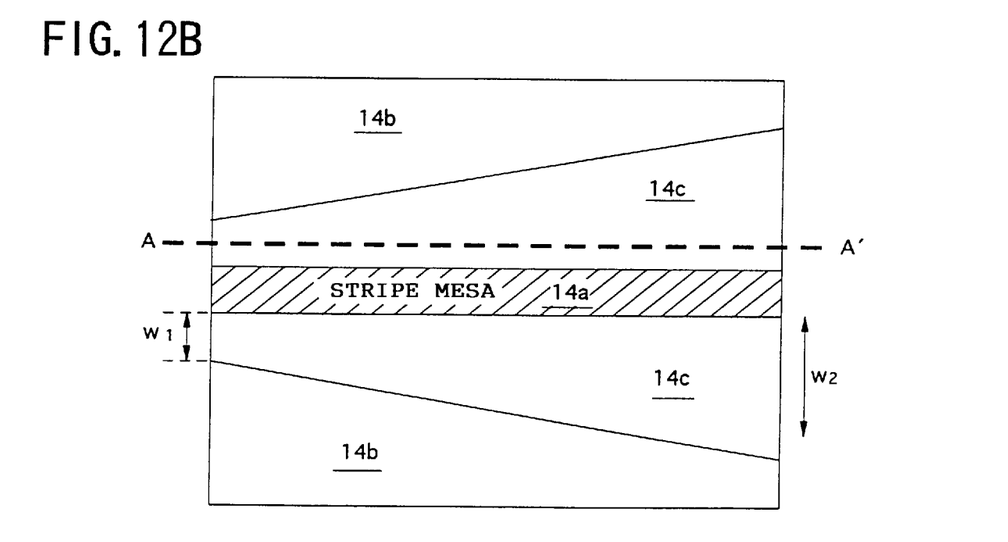
FIG. 12B is a top view of the structure of FIG. 11C and FIG. 12A.

FIG. 12B is a top view of the structure of FIG. 11C and FIG. 12A. As shown in FIG. 12B, the shape of the trench 14c is similar in the top view to the shape of the masks 21A and 21B shown in FIG. 10C. That is, the width W is a minimum $W_1$ at the emitting end face $f_1$ and a maximum $W_2$ at the reflecting end face $f_2$.

Figure 13:
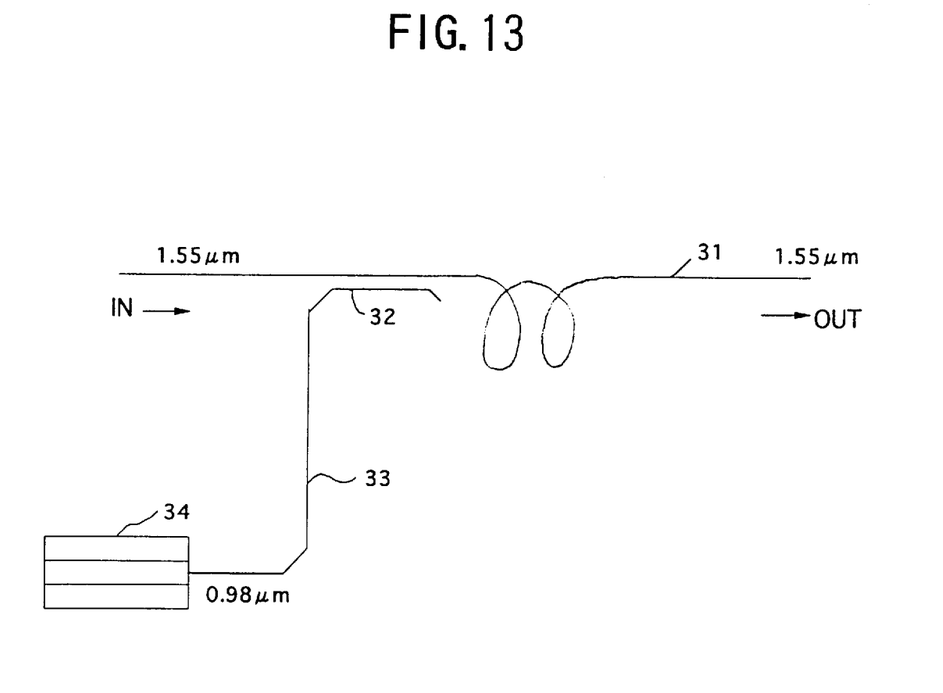
FIG. 13 shows the construction of the optical fiber amplifier in which the laser diode of the present invention is used.

FIG. 13 shows the construction of the optical fiber amplifier in which the laser diode of the present invention is used as a pumping light source.

Referring to FIG. 13, the optical fiber amplifier comprises an optical fiber 31 for transmitting an optical signal in the 1.55 μm frequency band, and a directional coupler 32 for coupling the optical fiber 31 to another optical fiber 33. A laser diode 34 according to the present invention capable of laser oscillation in the 0.98 μm frequency band is coupled to an end of the optical fiber 33. As has been described, the laser diode 34 has a ridge structure in which light-confinement at the emitting end is weakened, and also has a current-confining structure for confining a current in the ridge structure. Thus, multimode laser oscillation is effectively prevented so that light can be efficiently injected into the optical fiber 33.

The present invention is not limited to the above described embodiments, and variations and modifications may be made without departing from the scope of the present invention.

What is claimed is:

1. A laser diode comprising:
   a semiconductor substrate extending axially from a first end face to a second end face and having a first conductivity;
   a first clad layer formed on said semiconductor substrate layer, extending axially from a third end face that corresponds to said first end face to a fourth end face that corresponds to said second end face, and having said first conductivity;
   an active layer formed on said first clad layer, extending axially from a fifth end face that corresponds to said third end face to a sixth end face that corresponds to said fourth end face, and producing a light beam according to stimulated emission;
   a second clad layer formed on said active layer, extending axially from a seventh end face that corresponds to said fifth end face to an eighth end face that corresponds to said sixth end face, and having a second conductivity different from said first conductivity;
   a ridge region formed on said second clad layer so as to project upward, extending axially from a ninth end face that corresponds to said seventh end face to a tenth end face that corresponds to said eighth end face, and having said second conductivity;
   a first electrode electrically connected to said semiconductor substrate and injecting carriers having a first polarity into said active layer;
   a second electrode electrically connected to said ridge region and injecting carriers having a second and inverse polarity to said active layer via said ridge region; and
   a pair of embedded regions provided on either side of said ridge region on said second clad layer to a thickness not exceeding a height of said ridge region, each of said embedded regions extending axially from an eleventh end face that corresponds to said ninth end face to a twelfth end face that corresponds to said tenth end face and having a first thickness at said eleventh end face and a second thickness substantially smaller than said first thickness at said twelfth end face, so as to confine a current in said second clad layer.

2. The laser diode as claimed in claim 1, wherein said pair of embedded regions are formed of a semiconductor layer having said first conductivity.

3. The laser diode as claimed in claim 1, wherein said pair of embedded regions are formed of a semiconductor layer having a high resistance.

4. The laser diode as claimed in claim 1, wherein each of said pair of embedded regions, said ridge region, and said second clad layer have substantially a same refractive index.

5. The laser diode as claimed in claim 1, wherein said pair of embedded regions are formed of a semiconductor having a lattice constant that provides a lattice mismatching within a −0.03% range in relation to a lattice constant of said semiconductor substrate.

6. The laser diode as claimed in claim 1, wherein said first, third, fifth, seventh, ninth and eleventh end faces carry an antireflection film, and said second, fourth, sixth, eighth, tenth and twelfth end faces carry a reflecting film.

7. A laser diode comprising:
   a semiconductor substrate extending axially from a first end face to a second end face and having a first conductivity:
   a first clad layer formed on said semiconductor substrate layer, extending axially from a third end face that corresponds to said first end face to a fourth end face that corresponds to said second end face, and having said first conductivity;
   an active layer formed on said first clad layer, extending axially from a fifth end face that corresponds to said third end face to a sixth end face that corresponds to said fourth end face, and producing a light beam according to stimulated emission;
   a second clad layer formed on said active layer, extending axially from a seventh end face that corresponds to said fifth end face to an eighth end face that corresponds to said sixth end face, and having a second conductivity different from said first conductivity;

a first electrode electrically connected to said semiconductor substrate and injecting carriers having a first polarity into said active layer:

a second electrode electrically connected to said ridge region and injecting carriers having a second and inverse polarity to said active layer via said ridge region; and a pair of embedded regions provided on either side of said ridge region on said second clad layer to a thickness not exceeding a height of said ridge region, each of said embedded regions extending axially from an eleventh end face that corresponds to said ninth end face to a twelfth end face that corresponds to said tenth end face and having its thickness continuously decreasing away from said eleventh end face toward said twelfth end face, so as to confine a current in said second clad layer.

8. A laser diode comprising:

a semiconductor substrate extending axially from a first end face to a second end face and having a first conductivity:

a first clad layer formed on said semiconductor substrate layer, extending axially from a third end face that corresponds to said first end face to a fourth end face that corresponds to said second end face, and having said first conductivity:

an active layer formed on said first clad layer, extending axially from a fifth end face that corresponds to said third end face to a sixth end face that corresponds to said fourth end face and producing a light beam according to stimulated emission:

a second clad layer formed on said active layer, extending axially from a seventh end face that corresponds to said fifth end face to an eighth end face that corresponds to said sixth end face, and having a second conductivity different from said first conductivity;

a ridge region formed on said second clad layer so as to project upward, extending axially from a ninth end face that corresponds to said seventh end face to a tenth end face that corresponds to said eighth end face, and having said second conductivity:

a first electrode electrically connected to said semiconductor substrate and injecting carriers having a first polarity into said active layer;

a second electrode electrically connected to said ridge region and injecting carriers having a second and inverse polarity to said active layer via said ridge region; and a pair of embedded regions provided on either side of said ridge region on said second clad layer to a thickness not exceeding a height of said ridge region, each of said embedded regions extending axially from an eleventh end face that corresponds to said ninth end face to a twelfth end face that corresponds to said tenth end face and having a first width at said eleventh end face and a second width substantially greater than said first width at said twelfth end face so as to confine a current in said second clad layer.

9. An optical communications system comprising:

a first optical fiber transmitting an optical signal having a first wavelength and incident on a first end, and emitting the optical signal from a second end;

a second optical fiber optically coupled at one end to said first optical fiber between said first end and said second end; and a laser diode optically coupled to the other end of said second optical fiber and oscillating at a second wavelength shorter than said first wavelength, wherein said laser diode comprising:

a semiconductor substrate extending axially from a first end face to a second end face and having a first conductivity;

a first clad layer formed on said semiconductor layer, extending axially from a third end face that corresponds to said first end face to a fourth end face that corresponds to said second end face, and having said first conductivity;

an active layer formed on said first clad layer, extending axially from a fifth end face that corresponds to said third end face to a sixth end face that corresponds to said fourth end face, and producing a light beam according to stimulated emission;

a second clad layer formed on said active layer, extending axially from a seventh end face that corresponds to said fifth end face to an eighth end face that corresponds to said sixth end face, and having a second conductivity different from said first conductivity;

a ridge region formed on said second clad layer so as to project upward, extending axially from a ninth end face that corresponds to said seventh end face to a tenth end face that corresponds to said eighth end face, and having said second conductivity;

an antireflection film formed on said first, third, fifth, seventh and ninth end faces;

a reflecting film formed on said second, fourth, sixth, eighth and tenth end faces;

a first electrode electrically connected to said semiconductor substrate and injecting carriers having a first polarity into said active layer;

a second electrode electrically connected to said ridge region and injecting carriers having a second and inverse polarity to said active layer via said ridge region; and a pair of embedded regions provided on either side of said ridge region on said second clad layer to a thickness not exceeding a height of said ridge region, each of said embedded regions extending axially from an eleventh end face that corresponds to said ninth end face to a twelfth end face that corresponds to said tenth end face and having a first thickness at said eleventh end face and a second thickness substantially smaller than said first thickness at said twelfth end face, so as to confine a current in said second clad layer, wherein said antireflection film covers said eleventh end face, and said reflecting film covers said twelfth end face.

* * * * *